United States Patent [19]

Ueda

[11] Patent Number: 5,793,244
[45] Date of Patent: Aug. 11, 1998

[54] LOGARITHMIC CONVERSION CIRCUIT

[75] Inventor: Koichi Ueda, Nerima-ku, Japan

[73] Assignee: Advantest Corporation, Tokyo, Japan

[21] Appl. No.: 799,454

[22] Filed: Feb. 13, 1997

[30] Foreign Application Priority Data

Feb. 20, 1996 [JP] Japan ................... 8-032075

[51] Int. Cl.[6] .................... H03G 11/08; G06G 7/24
[52] U.S. Cl. .................................... 327/351; 327/350
[58] Field of Search .................... 327/350, 351, 327/352, 552, 557, 558, 559, 407

[56] References Cited

U.S. PATENT DOCUMENTS

| | | | |
|---|---|---|---|
| 3,599,104 | 8/1971 | Pell | 327/351 |
| 4,215,344 | 7/1980 | Phillips, Jr. | 343/18 E |
| 5,027,121 | 6/1991 | Hulland | 342/16 |
| 5,666,429 | 9/1997 | Urbanski | 381/94.1 |

*Primary Examiner*—Toan Tran
*Attorney, Agent, or Firm*—Kanesaka & Takeuchi

[57] ABSTRACT

A logarithmic conversion circuit includes a narrow band generating unit consisting of a local oscillator (104) and a mixer (103) for receiving an output of the local oscillator and the input signal and a first band-pass filter (105) connected to the mixer for generating a narrow band signal from a broad band input signal; a selection member (106-7) directly connected to the first band-pass filter for selecting either the input signal or the narrow band signal; first and second LOG amps (108, 111) connected in series to the selection member; and a noise suppression unit connected in parallel between the first and second LOG amps and including a second band-pass filter (109) for transmitting only the broad band input signal and a low-pass filter (110) for transmitting only the narrow band signal.

4 Claims, 3 Drawing Sheets

5,793,244

LOGARITHMIC CONVERSION CIRCUIT

BACKGROUND OF THE INVENTION

1. Field of the Invention

The present invention relates to logarithmic conversion circuits and, particularly, to a logarithmic conversion circuit useful in an input circuit of waveform analyzing equipment, such as spectrum analyzers, and capable of not only making logarithmic conversion of broad band signals but also generating narrow band signals of the input signals for logarithmic conversion.

2. Description of the Related Art

FIG. 1 shows a conventional logarithmic conversion circuit of this type. The conversion circuit consists of an intermediate frequency (IF) section which includes an input terminal 201, a band-pass filter 202, a mixer 203, a local oscillator 204, a band-pass filter 205, switches 206 and 207, and a mixer 210 and a logarithmic conversion (LOG) section which includes a LOG amplifiers 208 and 211 and a band-pass filter 209.

A signal fed to the input terminal 201 is subjected to waveform shaping in the band-pass filter 202 and outputted a signal of a predetermined frequency band to the mixer 203 and the switch 207. The mixer 203 also receives an output from the local oscillator 204 and outputs these intermediate frequency signals to the band-pass filter 205. The output from the mixer 203 is subjected to waveform shaping in the band-pass filter 205 and fed to the mixer 210. The mixer 210 receives an output from the local oscillator 204 as well as the output of the band-pass filter 205 and feeds these IF signals to the switch 206.

The band-pass filter 202 is selected so as to match the input signal to be measured. For example, if the central frequency of the signal to be measured is 21.4 MHz, a bandpass filter having a central frequency of 21.4 MHz and a transmission band of approx. 500 KHz is selected.

The transmission band of band-pass filters depends on the central transmission frequency. If the central frequency is high, it is impossible to narrow the transmission band. For this reason, the output of the local oscillator 204 having an oscillation frequency of 24.98 MHz is mixed in the mixer 203 to form an IF signal having a central frequency 3.58 MHz, which is fed to the band-pass filer 205.

The band-pass filer 205 is a very narrow band filter having a central transmission frequency of 3.58 MHz and a transmission band of approx. 300 Hz and generate narrow band signals. The output from the band-pass filter 205 is mixed again with the output of the local oscillator 204 in the mixer 210 to form an IF signal having a central frequency of 21.4 MHz, which is fed to the switch 206.

The switches 206 and 207 are switched such that only one of them is closed so as to provide, as IF section output, either the narrow band signal from the switch 206 or the broad band signal from the switch 207.

In the LOG section, logarithmic conversion is made in the LOG amps 208 and 211, and the noise is suppressed in the band-pass filter 209 provided between them. The central frequency and the transmission band of the band-pass filter 209 are 21.4 MHz, which is the central frequency of the IF section, and 500 KHz, respectively. Both of the LOG amps 208 and 211 are used so as to provide precise logarithmic conversion.

The mixer 210 is used to align the central frequency of the wide band signal from the switch 207 to the central frequency of the band-pass filter 209 so that the band-pass filter 209 is able to suppress the noise in either the narrow band signal from the switch 206 or the broad band signal from the switch 207.

The output of the LOG amp 211 is fed to the A/D converter of a waveform analyzer for analyzing the waveform.

In the conventional logarithmic conversion circuit, the circuits of the LOG section are connected in series so that it is necessary to match both of the central frequencies in the narrow and broad band signals. Consequently, the low frequency signal for narrowing the band is subjected to mixing again for broadening the band so that both the central frequencies match. In addition, the frequency conversion in the mixer requires laborious adjustment, leading to the high manufacturing costs.

SUMMARY OF THE INVENTION

Accordingly, it is an object of the invention to provide a logarithmic conversion circuit which is manufactured at low costs.

According to the invention there is provided a logarithmic conversion circuit which includes at least one narrow band generating unit for generating from a broad band input signal a narrow band signal having a different central frequency from that of the broad band input signal; a selection member directly connected to the narrow band generating unit for selecting either the narrow band signal or the broad band input signal; first and second LOG amps connected in series to the selection member; and a noise suppression unit provided between the first and second LOG amps.

The narrow band generating unit may consist of a local oscillator, a mixer for receiving an output of the local oscillator and the broad band input signal and outputting an IF signal, and a band-pass filter connected to the mixer for feeding the narrow band signal to the selection member.

The noise suppression unit may include a band-pass and low-pass filters connected in parallel between the first and second LOG amps for transmitting only the broad band input signal and the narrow band signal, respectively.

It is noted that the central frequency of a signal generated by the narrow band generating unit is different from that of the input signal to thereby eliminate the need for the second mixing to align the central frequencies of the IF outputs.

The noise suppression unit has both the band-pass filter and the low-pass filter so that the signal selected by the selection member passes through only the corresponding filter for logarithmic conversion. The lower limit of the IF band outputted from the mixer of the narrow band generating unit is set below the transmission band of the second band-pass filter so as to block the narrow band signal. In the case of a plurality of narrow band generating units, a plurality of band-pass filters are provided to produce similar effects.

DESCRIPTION OF THE PREFERRED EMBODIMENT

Figure 2:
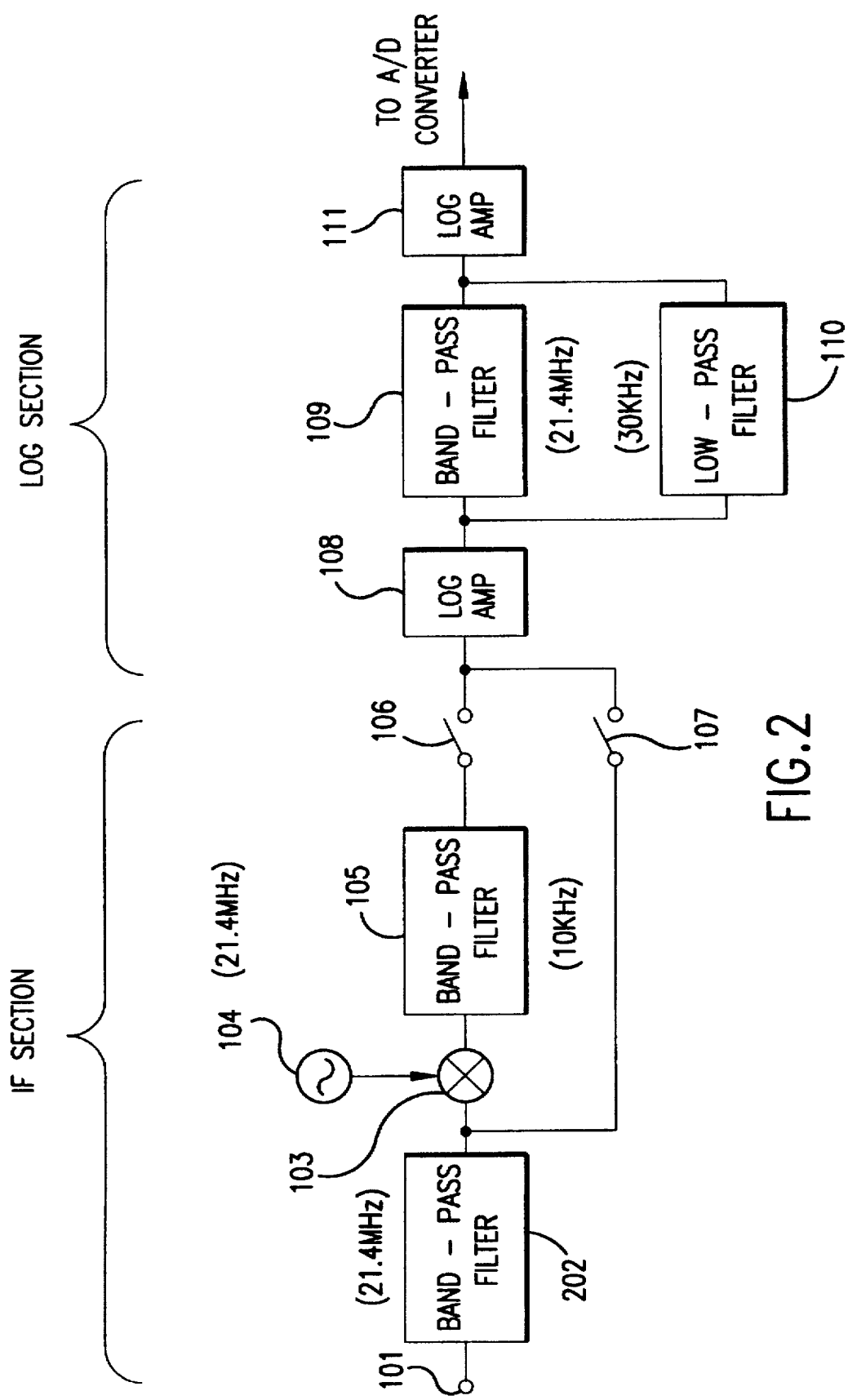
FIG. 2 is a block diagram of a logarithmic conversion circuit according to an embodiment of this invention.

In FIG. 2, the logarithmic conversion circuit consists of an IF section which includes an input terminal 101, a band-pass filter 102, a mixer 103, a local oscillator 104, a band-pass filer 105, and switches 106 and 107 as selection means and a LOG section which includes LOG amps 108 and 111, a low-pass filter 110, and a band-pass filer 109. The mixer 103, the local oscillator 104, and the band-pass filter 105 constitute a narrow band generating unit.

A signal fed to the input terminal 101 is subjected to waveform shaping in the band-pass filter 102 to form a signal having a predetermined transmission frequency band and fed to the mixer 103 and the switch 107. The mixer 103 receives the output of the local oscillator 104 as well as the output of the band-pass filter 102 to feed the band-pass filter 105 with these IF signals. The output of the mixer 103 is subjected to waveform shaping in the band-pass filter 105 and fed to the switch 106.

In this embodiment, the central frequency of the signal to be measured is 21.4 MHz. Consequently, the band-pass filter 102 used has a central transmission frequency of 21.4 MHz and a transmission band of approx. 500 KHz. The local oscillator 104 has an oscillation frequency of 21.4 MHz so as to generate a narrow band signal. The IF signal having a central frequency of 10 KHz generated in the mixer 103 is fed to the band-pass filter 105.

The band-pass filter 105 is a very narrow band filter having a central transmission frequency of 10 KHz and a transmission band of approx. 30 Hz and generates narrow band signals. The output of the band-pass filer 105 is fed to the switch 106.

The witches 106 and 107 are switched such that only one of them is closed to provide either the narrow band signal having a central frequency of 10 KHz from the switch 106 or the broad band signal having a central frequency of 21.4 MHz from the switch 107.

In the LOG section, logarithmic conversion is made in the LOG amps 108 and 111. A band-pass filter 109 and a low-pass filer 110 are provided in parallel between the LOG amps 108 and 111 so as to suppress the noise. The band-pass filter 109 is provided for the broad band signal and has a central frequency 21.4 MHz and a transmission band of 500 KHz. The low-pass filter 110 is provided for the narrow band signal from the IF section and transmits only signals below 30 KHz.

Figure 1:
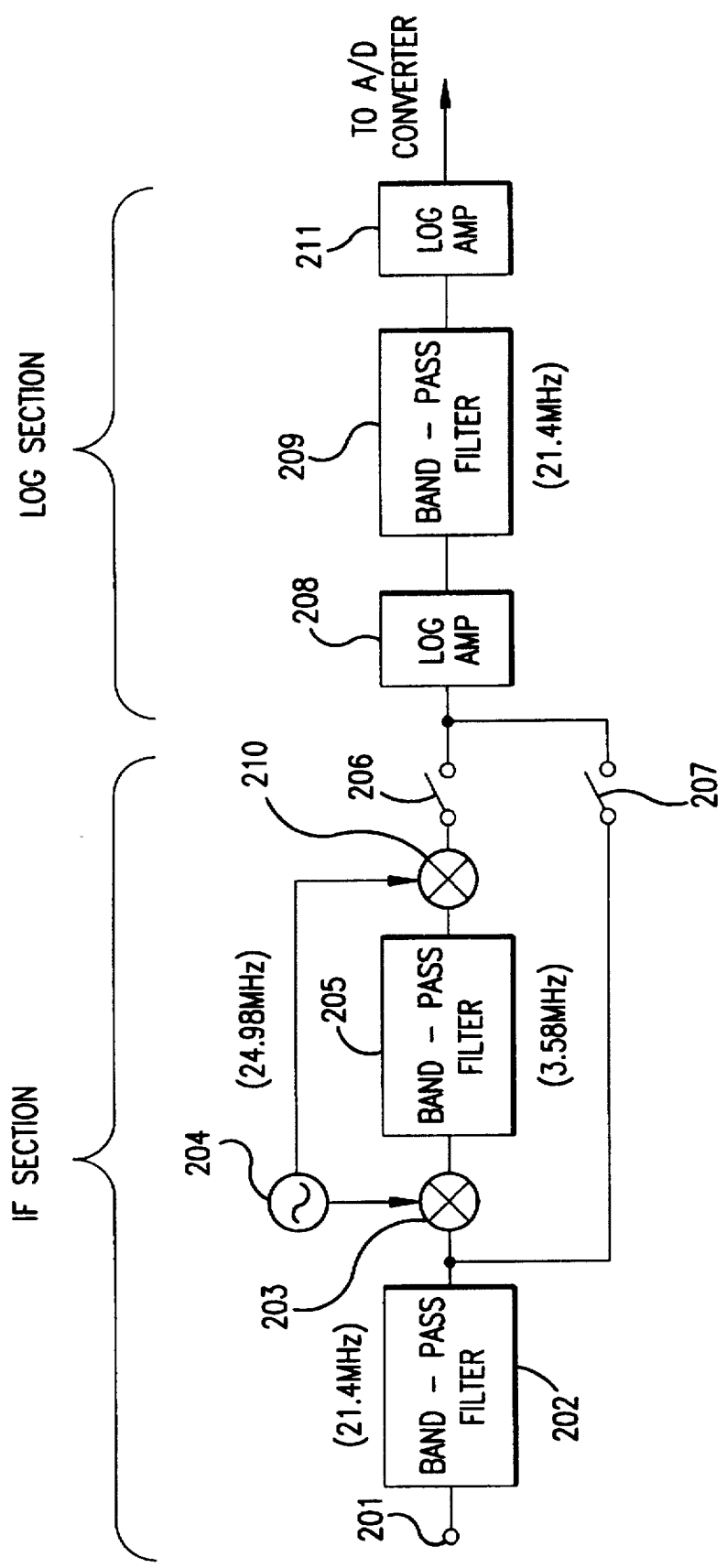
FIG. 1 is a block diagram of the conventional logarithmic conversion circuit.

Unlike the conventional circuit as shown in FIG. 1, the broad and narrow band signals outputted from the IF have different central frequencies.

The broad band signal from the LOG amp 108 is blocked by the low-pass filter 110 and undergoes noise suppression in the band-pass filter 109 and fed to the LOG amp 111. The narrow band signal having a low central frequency cannot pass the band-pass filter 109 and undergoes noise suppression in the low-pass filter 110 and is fed to the LOG amp 111. The output of the LOG amp 111 is fed to an A/D converter of waveform analyzing equipment for analyzing waveforms.

According to the invention, it is necessary to use only a single frequency conversion circuit (mixer 103) which requires laborious adjustment, by adding a low-pass filter 110 which has a simple structure and is so easy to adjust that the manufacturing costs are reduced.

Alternatively, the switches 106 and 107 may be replaced by a multiple-input, single-output switch to select the broad or narrow signal from the IF section.

Figure 3:
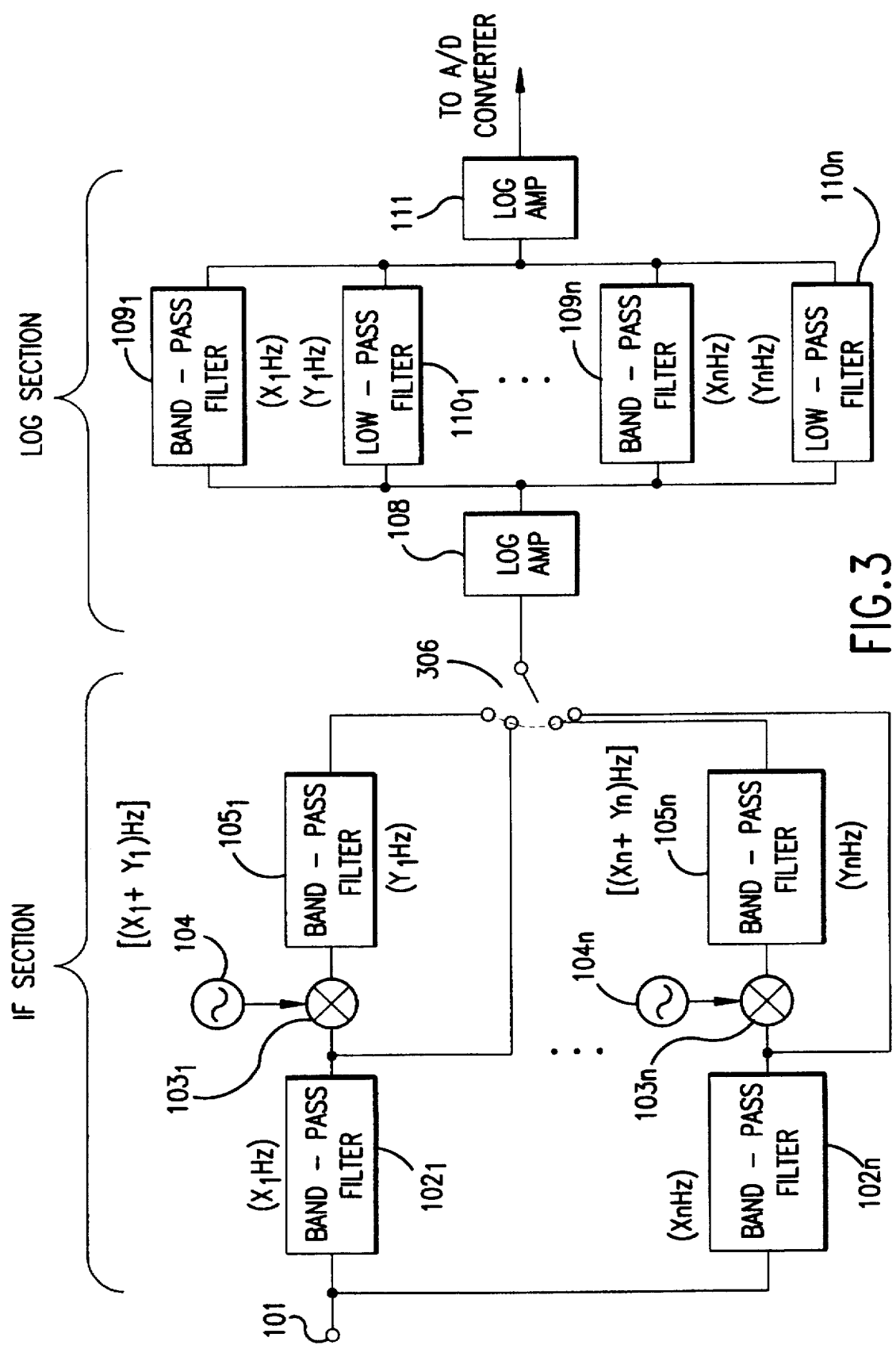
FIG. 3 is a block diagram of a logarithmic conversion circuit according to the other embodiment of this invention.

FIG. 3 shows such a structure, wherein the band-pass filter 102 and 105, the mixer 103, and the local oscillator 104 of the IF section are replaced by n sets of band-pass filters $102_1$–$121_n$ and $105_1$–$105_n$, mixers $103_1$–$103_n$, and local oscillator $104_1$–$104_n$ and those of the LOG section by band-pass filters $109_1$–$109_n$ and low-pass filters $110_1$–$110_n$.

The central transmission frequencies of band-pass filters $102_m$ and $109_m$ in an m set (1<m<n) are made equal, and the central transmission frequency of a band-pass filter $105m$ and the cut-off frequency of a low-pass filter $110_m$ are made equal.

The outputs of the band-pass filters $102_1$–$102_n$ and $105_1 105_n$ are fed to a multiple-input, single-output switch 306 so that one of them is outputted to the LOG amp 108. The output of the LOG amp 108 is fed to the band-pass filters $109_1$–$109_n$ and the low-pass filters $110_1$–$110_n$. The outputs of the band-pass filters $109_1$–$109_n$ and the low-pass filters $110_1$–$110_n$ are fed to a multiple-input, single-output switch 307 so that one of them is outputted to an A/D converter of waveform analyzing equipment via the LOG amp 111.

The operations of the switches 306 and 307 are linked; i.e., when the switch 306 selects a band-pass filter $102_m$, the switch 307 selects the band-pass filter $109_m$ while when the switch 306 selects a band-pass filter $105_m$, the switch 307 selects the low-pass filter $110_m$. With this structure, it is possible to provide a plurality of narrow band signals having different characteristics.

As has been described above, the logarithmic conversion circuit according to the invention enables to select the narrow band output with the filter. Only a single frequency conversion circuit is required to form a single narrow band generating unit, thus reducing the manufacturing costs.

What is claimed is:

1. A logarithmic conversion circuit comprising:

at least one narrow band generating means for generating from a broad band input signal a narrow band signal having a different central frequency from that of said broad band input signal;

selection means directly connected to said narrow band generating means for selecting either said narrow band signal or said broad band input signal;

first and second LOG amps connected in series to said selection means; and noise suppression means provided between said first and second LOG amps.

2. A logarithmic conversion circuit according to claim 1, wherein said narrow band generating means consists of a local oscillator, a mixer for receiving an output of said local oscillator and said broad band input signal and outputting an IF signal, and a band-pass filter connected to said mixer for feeding said narrow band signal to said selection means.

3. A logarithmic conversion circuit according to claim 1, wherein said noise suppression means comprises a band-pass and low-pass filters connected in parallel between said first and second LOG amps for selectively transmitting said broad band input signal or said narrow band signal.

4. A logarithmic conversion circuit comprising:

narrow band generating means including a local oscillator and a mixer for receiving an output of said local oscillator and a board band input signal and a first band-pass filter connected to said mixer for generating a narrow band signal from said broad band input signal;

selection means directly connected to said first band-pass filter for selecting either said input signal or said narrow band signal;

first and second LOG amps connected in series to said selection means; and noise suppression means connected in parallel between said first and second LOG amps and including a second band-pass filter for transmitting only said broad band input signal and a low-pass filter for transmitting only said narrow band signal.

* * * * *